United States Patent
Li et al.

(10) Patent No.: US 8,476,721 B2
(45) Date of Patent: Jul. 2, 2013

(54) MAGNET-ASSISTED TRANSISTOR DEVICES

(75) Inventors: Yang Li, Bloomington, MN (US); Insik Jin, Eagan, MN (US); Harry Liu, Maple Grove, MN (US); Song S. Xue, Edina, MN (US); Shuiyuan Huang, Apple Valley, MN (US); Michael X. Tang, Bloomington, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 158 days.

(21) Appl. No.: 13/088,832

(22) Filed: Apr. 18, 2011

(65) Prior Publication Data
US 2011/0193148 A1    Aug. 11, 2011

Related U.S. Application Data

(63) Continuation of application No. 12/193,065, filed on Aug. 18, 2008, now Pat. No. 7,948,045.

(51) Int. Cl.
*H01L 29/82* (2006.01)
*H01L 21/00* (2006.01)
*H01L 21/326* (2006.01)

(52) U.S. Cl.
USPC ........... 257/421; 257/295; 257/315; 257/427; 257/E29.3; 257/E29.324; 257/E29.327; 257/E21.436; 257/E21.665; 438/3; 438/48

(58) Field of Classification Search
USPC .......... 257/295, 315, 421, 427, E29.327, 257/E29.3, E29.324, E21.436, E21.665; 438/3, 438/48
See application file for complete search history.

(56) References Cited

U.S. PATENT DOCUMENTS

| | | | |
|---|---|---|---|
| 5,959,896 A | 9/1999 | Forbes | |
| 6,480,412 B1 | 11/2002 | Bessho | |
| 6,956,269 B1 * | 10/2005 | Vashchenko et al. | 257/421 |
| 2005/0017165 A1 | 1/2005 | Franzen | |
| 2006/0118839 A1 | 6/2006 | Sugahara et al. | |
| 2007/0155099 A1 | 7/2007 | Takata et al. | |
| 2007/0279977 A1 | 12/2007 | Banerjee et al. | |
| 2008/0070339 A1 * | 3/2008 | Power et al. | 438/48 |
| 2008/0265243 A1 * | 10/2008 | Ahn et al. | 257/30 |
| 2009/0129167 A1 | 5/2009 | Banerjee | |
| 2010/0182837 A1 | 7/2010 | Jin | |

OTHER PUBLICATIONS

Cheng Kuan et al, "New Magnetic Flash Memory with FePt Magnetic Floating Gate", JP Journal of Applied Physics, vol. 45, No. 4B, 2006, pp. 3217-3221.

* cited by examiner

*Primary Examiner* — Long Tran
(74) *Attorney, Agent, or Firm* — Fredrikson & Byron, P.A.

(57) ABSTRACT

A transistor device includes a magnetic field source adapted to deflect a flow of free electron carriers within a channel of the device, between a source region and a drain region thereof. According to preferred configurations, the magnetic field source includes a magnetic material layer extending over a side of the channel that is opposite a gate electrode of the transistor device.

20 Claims, 5 Drawing Sheets

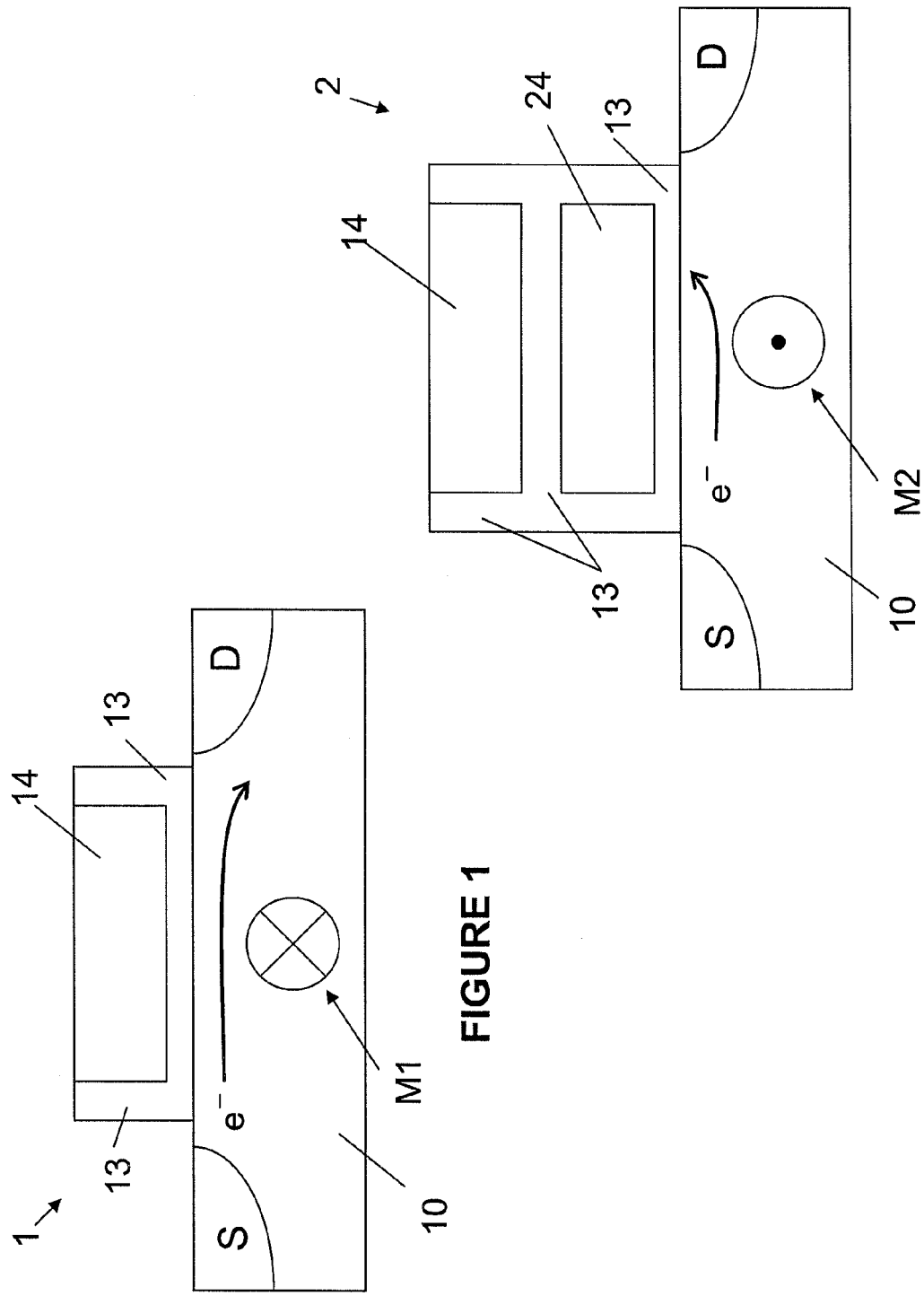

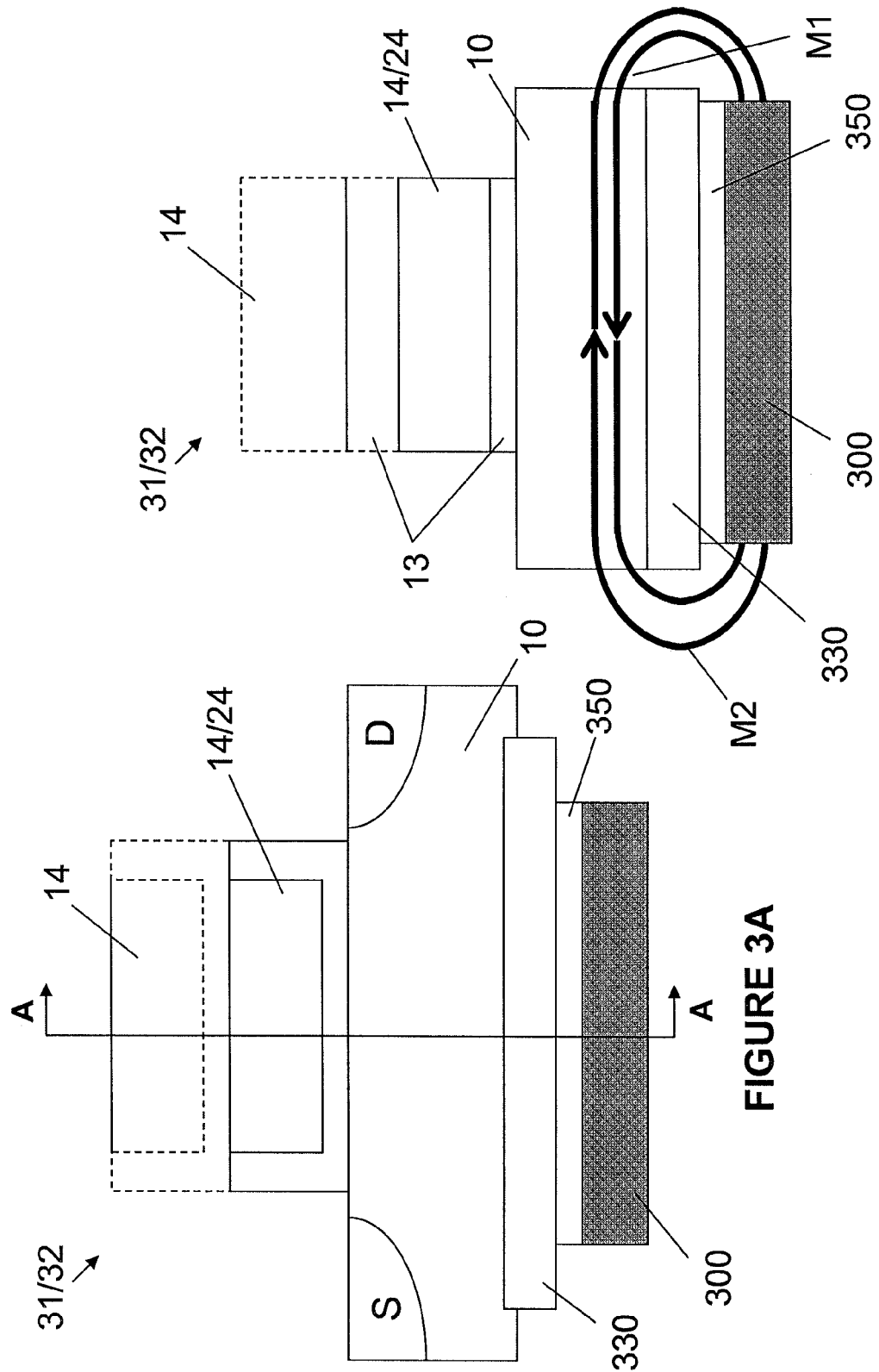

MAGNET-ASSISTED TRANSISTOR DEVICES

CROSS REFERENCE TO RELATED APPLICATIONS

The present application is a continuation application and claims priority to U.S. application Ser. No. 12/193,065 filed Aug. 18, 2008, the teachings of which are incorporated herein by reference.

BACKGROUND

The structure of standard metal-oxide semiconductor field-effect transistor (MOSFET) devices, as well as that of the floating gate-type, are well known to those skilled in the art, wherein the standard MOSFET device functions as a switch, which is responsive to a control voltage applied to a gate structure thereof, while the floating gate transistor device stores charge in order to function as flash memory. The gate structure of both types of devices overlie a semiconductor substrate in which a channel extends between source and drain regions, and a voltage applied to the gate structure of each stimulates a flow of free electron carriers from the source region toward the drain region.

For the standard MOSFET device, switching speed and efficiency can be negatively impacted by a phenomena known as "hot carrier effect", or "hot electron effect", which occurs when the electric field strength, near the drain region, becomes high enough to accelerate electrons toward the oxide interface between the gate structure and the channel, so that the free electrons become trapped therein. Modifications to the semiconductor substrate of the standard MOSFET structure, for example, creating lightly doped drain regions, to deflect the flow of free electron carriers away from the gate structure, are known in the art. Conversely, for the floating gate-type transistor device, injection of free electrons into the gate structure, in order to charge the floating gate, is desired, thus, the hot electron effect is exploited and further enhanced, for example, by biasing the floating gate at a relatively high voltage in order to deflect the flow of free electrons toward the floating gate, and thereby charge the floating gate, via what is known as 'hot electron injection'. The present disclosure presents some alternative transistor configurations for deflecting the flow of free electron carriers within the channels thereof.

BRIEF SUMMARY

According to embodiments of the present disclosure, a transistor device, which includes a source region, a drain region and a channel region, all formed in a semiconductor substrate, and a gate electrode, which extends over the channel region, on a first side of the semiconductor substrate, further includes a magnetic field source. The magnetic field source is adapted to create a magnetic field that deflects the flow of free electron carriers, between the source region and the drain region, within the channel region of the semiconductor substrate. According to some embodiments, the magnetic field source creates the magnetic field having a direction to deflect the flow of free electron carriers toward the gate electrode; while, according to alternative embodiments, the magnetic field source creates the magnetic field having a direction to deflect the flow of free electrons away from the gate electrode. Preferably, embodiments of the present disclosure are formed by depositing a magnetic material layer adjacent the channel region of the semiconductor substrate, on a second side of the substrate, which is opposite the gate electrode, after forming the gate electrode.

BRIEF DESCRIPTION OF THE DRAWINGS

The following drawings are illustrative of particular embodiments of the disclosure and therefore do not limit the scope of the invention. The drawings are not to scale (unless so stated) and are intended for use in conjunction with the explanations in the following detailed description. Embodiments of the disclosure will hereinafter be described in conjunction with the appended drawings, wherein like numerals denote like elements.

FIG. 1 is a cross-section view of a first type of transistor device, which schematically depicts a first group of embodiments.

FIG. 2 is a cross-section view of a second type of transistor device, which schematically depicts a second group of embodiments.

FIG. 3A is a cross-section view of either type of transistor device, according to some preferred embodiments of the present disclosure.

FIG. 3B is another cross-section view, taken through section line A-A of FIG. 3A.

DETAILED DESCRIPTION

Figure 4:
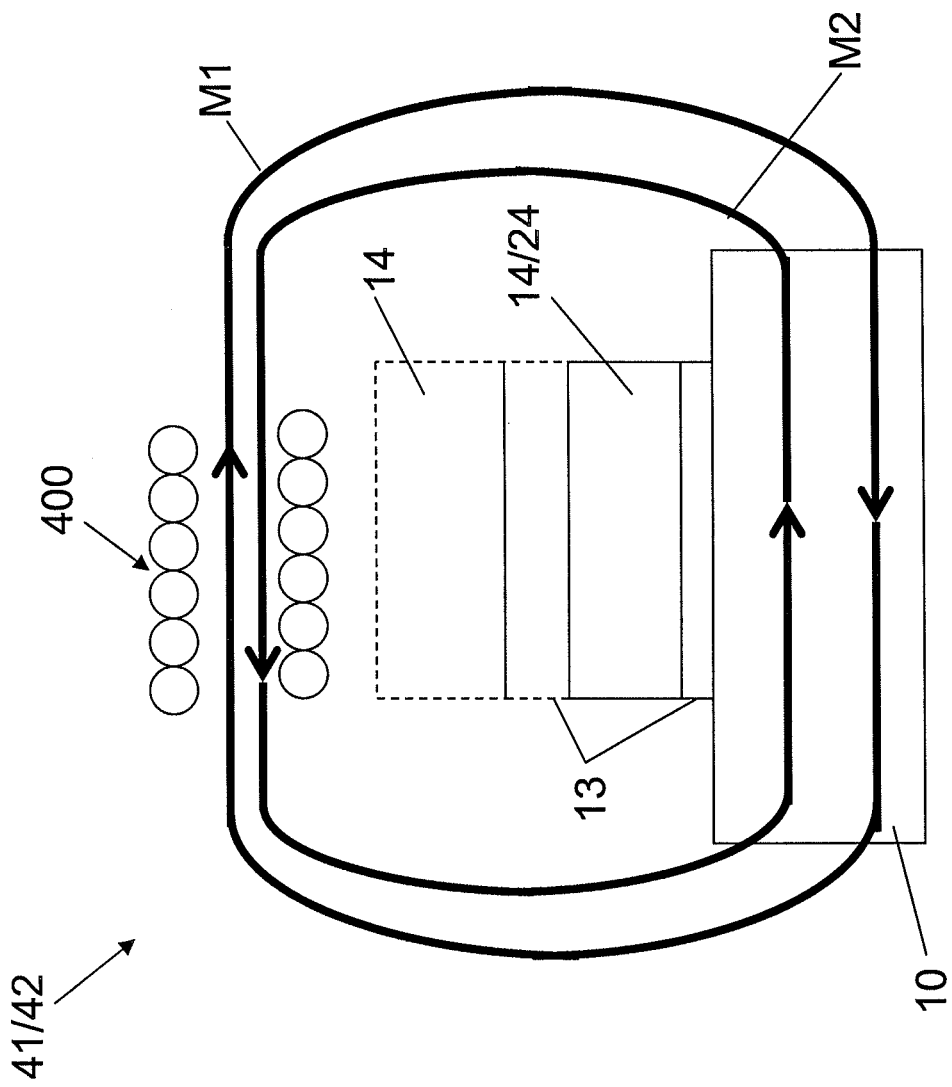
FIG. 4 is a cross-section view of either type of transistor device, according to some alternate embodiments.

The following detailed description is exemplary in nature and is not intended to limit the scope, applicability, or configuration of the invention in any way. Rather, the following description provides practical illustrations for implementing exemplary embodiments.

FIG. 1 is a cross-section view of a first type of transistor device 1, which schematically depicts a first group of embodiments. FIG. 1 illustrates transistor device 1 including a source region S and a drain region D, which are formed in a semiconductor substrate 10, for example, a P-type silicone substrate; a control gate electrode 14 lies adjacent a channel portion of substrate 10, which channel portion extends between source S and drain D, and control gate electrode 14 is separated from the channel portion by an oxide layer 13, for example, silicon dioxide ($SiO_2$), which is shown extending upward, around opposing sides of gate electrode 14. FIG. 1 schematically depicts a magnetic field M1, which is directed through the channel region of substrate 10, in a direction into the page, so that field M1, via the resulting Lorentz force, deflects the flow of free electron carriers $e^-$, between source S and drain D, away from gate electrode 14. According to this first group of embodiments, transistor device 1 includes a magnetic field source adapted to create field M1 in order to mitigate the 'hot electron' effect, thereby preserving stable, efficient and reliable switching performance of transistor device 1.

FIG. 2 is a cross-section view of a second type of transistor device 2, which schematically depicts a second group of embodiments. FIG. 2 illustrates transistor device 2 including, like transistor device 1, a source region S and a drain region D, which are formed in a semiconductor substrate 10, for example, a P-type silicone substrate; in addition to control gate electrode 14, device 2 includes a floating gate electrode 24, which is located between control gate electrode 14 and the channel region of substrate 10, and which is surrounded by oxide layer 13. FIG. 2 schematically depicts a magnetic field M2, which is directed through the channel region of substrate 10, in a direction out from the page, so that field M2, via the resulting Lorentz force, deflects the flow of free electron carriers e⁻, between source S and drain D, toward floating gate electrode 24 in order to accentuate hot electron injection in charging floating gate electrode 24 for flash memory function.

Various embodiments of magnetic field sources which may be incorporated into either of type of transistor device 1, 2 will be described below in conjunction with FIGS. 3A-6. It should be noted that dashed lines, in FIGS. 3A-6, are used to illustrate the alternative placement of control gate electrode 14 for the second type of transistor device, which further includes floating gate 24.

FIG. 3A is a cross-section view of either type of transistor device, a device 31, of the first type, or a device 32, of the second type, according to some preferred embodiments of the present disclosure; and FIG. 3B is another cross-section view, taken through section line A-A of FIG. 3A. FIGS. 3A-B illustrate device 31/32 including a magnetic material layer 300 extending beneath the channel portion of substrate 10 and over a side of substrate 10 which is opposite a side on which control gate electrode 14 is located. FIGS. 3A-B further illustrate an insulating layer 330, for example, a buried oxide layer, separating magnetic material layer 300 from substrate 10, and an optional additional barrier layer 350, for example, formed from Tantalum (Ta) or Tantalum Nitride (TaN), extending between insulating layer 330 and magnetic material layer 300, to further prevent diffusion of metals from magnetic material layer 300 into substrate 10. According to the illustrated embodiments, magnetic material layer 300, for device 31 (first type), has a magnetization orientation to create magnetic field M1, such that magnetic field M1 is directed to deflect the flow of free electron carriers e⁻ away from gate electrode 14, while, for device 32 (second type), has an opposite magnetization orientation to create a magnetic field M2, such that magnetic field M2 is directed to deflect free electron carriers e⁻ toward floating gate electrode 24.

Magnetic material layer 300 is preferably deposited, magnetically annealed and then patterned, following all or a majority of the CMOS (complimentary metal-oxide-semiconductor) fabrication steps for integrated circuits including one or both types of transistor devices 31/32. Examples of suitable materials, from which magnetic material layer 300 may be formed, include, without limitation, cobalt, iron and nickel; and a thickness of magnetic material layer 300 may be from tens of nanometers to many micrometers. It should be noted that, although the illustrated location of magnetic material layer 300 is preferred, so as not to complicate the overall fabrication process nor to compromise the function of control gate 14, alternate embodiments may include a magnetic material layer extending over gate electrode 14 on an opposite side of substrate 10.

FIG. 4 is a cross-section view, in the same plane as that for FIG. 3B, of either type of transistor device, a device 41, of the first type, or a device 42, of the second type, according to some alternate embodiments. FIG. 4 illustrates device 41/42 including a conductor coil 400 (shown in longitudinal section), which is patterned to extend over gate electrode 14 and the channel region of substrate 10. Although not shown, it should be appreciated that an exposed contact is coupled to coil 400 so that a current supply may be connected thereto. According to the illustrated embodiments, current flows in a direction through coil 400, for device 31 (first type), in order to create magnetic field M1, such that magnetic field M1 is directed to deflect the flow of free electron carriers e⁻ away from gate electrode 14, while, for device 32 (second type), in an opposite direction through coil 400 to create magnetic field M2, such that magnetic field M2 is directed to deflect free electron carriers e⁻ toward floating gate electrode 24.

Figure 5:
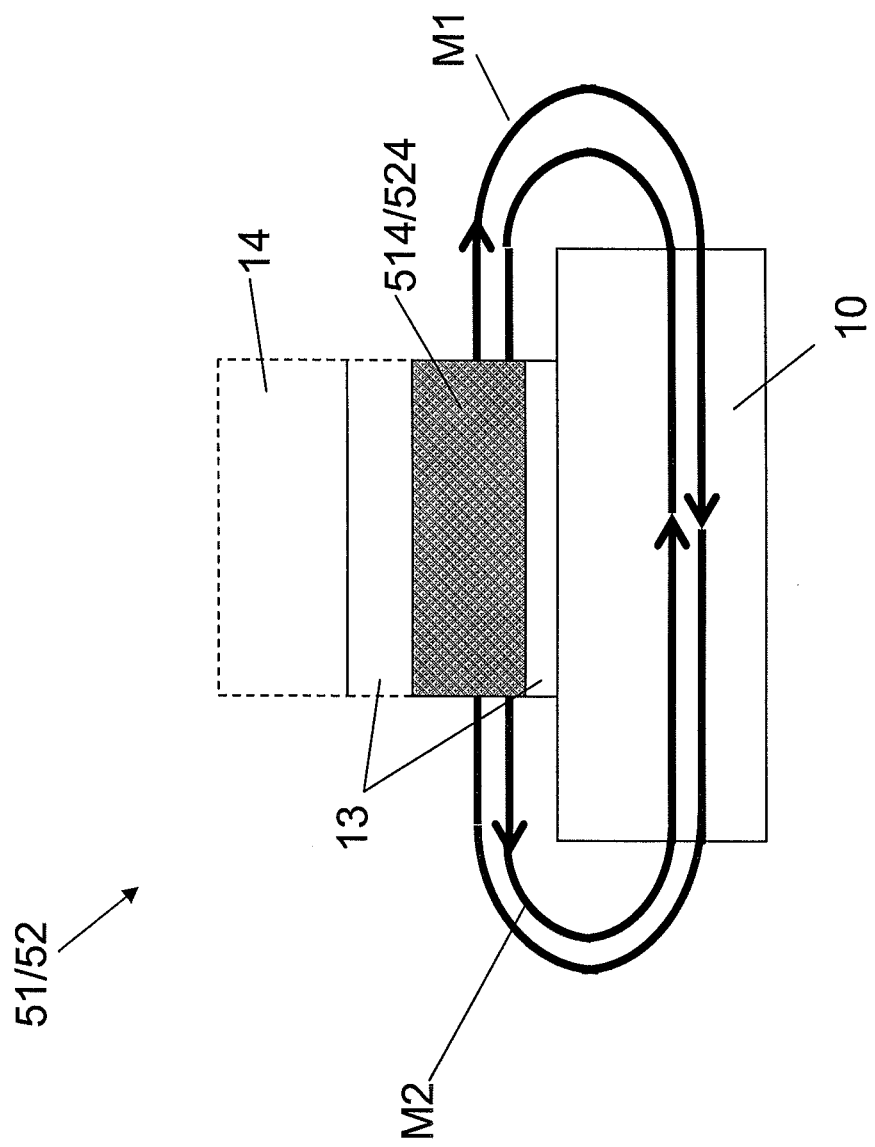
FIG. 5 is a cross-section view of either type of transistor device, according to some additional embodiments.

FIG. 5 is a cross-section view, in the same plane as that for FIG. 3B, of either type of transistor device, a device 51, of the first type, or a device 52, of the second type, according to some additional embodiments. FIG. 5 illustrates device 51/52 including a gate electrode 514/524 which is formed from a magnetic material. According to the illustrated embodiments, gate electrode 514 for device 51 (first type) is the control gate electrode and has a magnetization orientation to create magnetic field M1, such that magnetic field M1 is directed to deflect the flow of free electron carriers e⁻ away from gate electrode 514, while, gate electrode 524 for device 52 (second type), is the floating gate electrode and has an opposite magnetization orientation to create magnetic field M2, such that magnetic field M2 is directed to deflect free electron carriers e⁻ toward floating gate electrode 524. It should be noted that according to alternate embodiments of device 52 (second type), control gate electrode 14, rather than floating gate electrode 524, may be formed from a magnetic material that has a magnetization orientation to create magnetic field M2.

Figure 6:
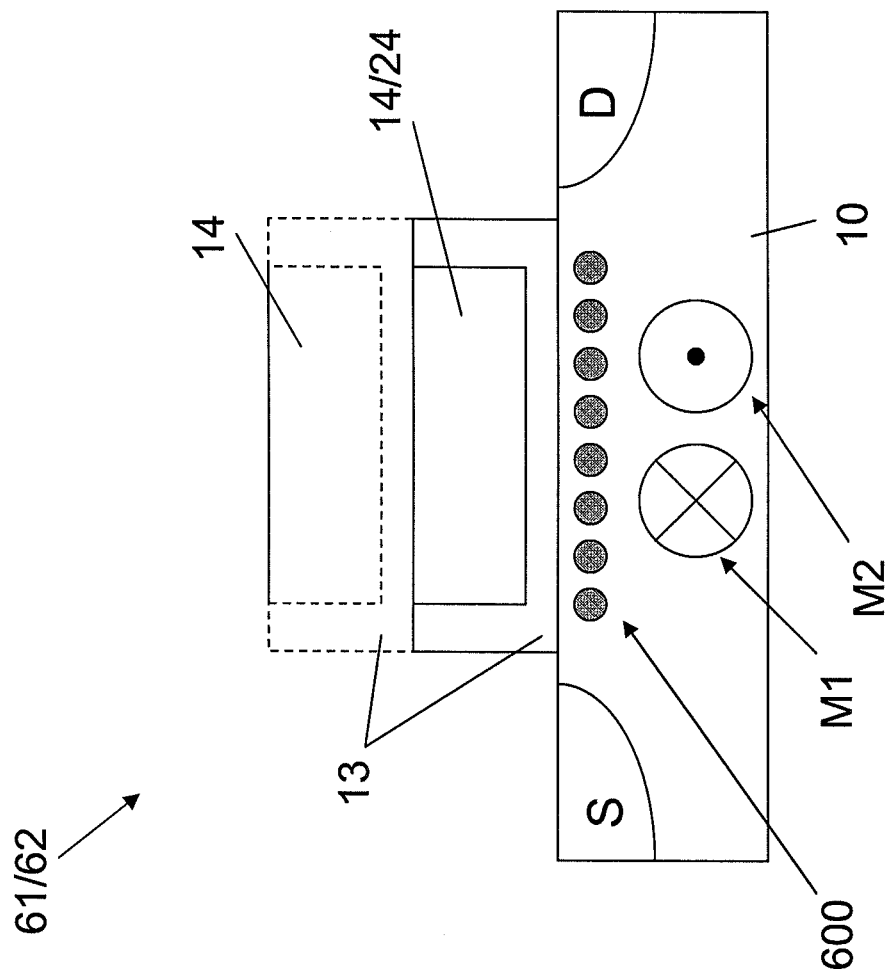
FIG. 6 is a cross-section view of either type of transistor device, according to yet further alternate embodiments.

FIG. 6 is a cross-section view, in the same plane as that for FIG. 3A, of either type of transistor device, a device 61, of the first type, and a device 62, of the second type, according to yet further alternate embodiments. FIG. 6 illustrates substrate 10 of device 61/62 being doped with magnetic ions 600, for example, cobalt, iron or nickel ions, in proximity to the interface with oxide layer 13. According to the illustrated embodiments, magnetic ions 600, for device 61 (first type), have a magnetization orientation to create magnetic field M1, such that magnetic field is directed to deflect the flow of free electron carriers e⁻ away from gate electrode 14, while, for device 62 (second type), have an opposite magnetization orientation to create magnetic field M2, such that magnetic field M2 is directed to deflect free electron carriers e⁻ toward floating gate electrode 24.

In the foregoing detailed description, embodiments of the disclosure have been described. These implementations, as well as others, are within the scope of the appended claims.

We claim:

1. A transistor device comprising:
   a semiconductor substrate including a source region, a drain region and a channel region, the channel region extending from the source region to the drain region;
   a gate electrode extending over the channel region on a first side of the semiconductor substrate; and
   a magnetic field source, the magnetic field source adapted to create a magnetic field that deflects the flow of free electron carriers, between the source region and the drain region, within the channel region of the semiconductor substrate, wherein the magnetic field source is on the first side of the semiconductor substrate, and wherein the gate electrode is formed from a magnetic material so as to comprise the magnetic field source.

2. The device of claim 1, wherein the magnetic field source is external to the semiconductor substrate.

3. The device of claim 1, wherein the gate electrode has a magnetization orientation to create the magnetic field, such that the magnetic field is directed to deflect the flow of free electron carriers away from the gate electrode.

4. The device of claim 3, wherein the gate electrode functions as a control gate and further comprising a floating gate electrode located between the gate electrode and the semiconductor substrate.

5. The device of claim 4, wherein the floating gate electrode has a magnetization orientation to create the magnetic field, such that the magnetic field is directed to deflect the flow of free electron carriers toward the floating gate electrode.

6. The device of claim 4, wherein the floating gate electrode is surrounded by an oxide layer.

7. The device of claim 1, further comprising an oxide layer separating the gate electrode from the channel region of the semiconductor substrate.

8. The device of claim 7, wherein the oxide layer is formed of silicon dioxide.

9. The device of claim 7, wherein the oxide layer extends around opposing sides of the gate electrode.

10. A transistor device comprising:
   a semiconductor substrate including a source region, a drain region and a channel region, the channel region extending from the source region to the drain region;
   a floating gate electrode extending over the channel region on a first side of the semiconductor substrate;
   a control gate electrode extending over the floating gate electrode; and
   a magnetic field source, the magnetic field source adapted to create a magnetic field, such that the magnetic field is directed to deflect the flow of free electron carriers, between the source region and the drain region, within the channel region of the semiconductor substrate, toward the floating gate electrode, wherein the magnetic field source comprises magnetic ions implanted within the channel region of the semiconductor substrate.

11. The device of claim 10, wherein the magnetic ions comprise ions doped within the channel region of the semiconductor substrate.

12. A transistor device comprising:
   a semiconductor substrate including a source region, a drain region and a channel region, the channel region extending from the source region to the drain region;
   a gate electrode extending over the channel region on a first side of the semiconductor substrate; and
   a magnetic field source, the magnetic field source adapted to create a magnetic field, such that the magnetic field is directed to deflect the flow of free electron carriers, between the source region and the drain region, within the channel region of the semiconductor substrate, wherein the magnetic field source comprises magnetic ions implanted within the channel region of the semiconductor substrate.

13. The device of claim 12, wherein the magnetic ions comprise ions doped within the channel region of the semiconductor substrate.

14. The device of claim 12, wherein the magnetic ions have a magnetization orientation to create the magnetic field, such that the magnetic field is directed to deflect the flow of free electron carriers away from the gate electrode.

15. The device of claim 12, further comprising an oxide layer separating the gate electrode from the channel region of the semiconductor substrate.

16. The device of claim 15, wherein the oxide layer extends around opposing sides of the gate electrode.

17. The device of claim 12, wherein the gate electrode functions as a control gate and further comprising a floating gate electrode located between the gate electrode and the semiconductor substrate.

18. The device of claim 17, wherein the magnetic ions have a magnetization orientation to create the magnetic field, such that the magnetic field is directed to deflect the flow of free electron carriers toward the floating gate electrode.

19. The device of claim 17, wherein the floating gate electrode is surrounded by an oxide layer.

20. The device of claim 17, wherein the floating gate electrode is surrounded by an oxide layer.

* * * * *